(12) United States Patent
Yoshihara

(10) Patent No.: US 7,315,329 B1
(45) Date of Patent: Jan. 1, 2008

(54) SOLID-STATE IMAGE-PICKUP DEVICE HAVING AN ACCUMULATION GATE FOR READING OUT, ACCUMULATING, AND ALLOCATING SIGNAL CHARGES

(75) Inventor: Satoshi Yoshihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/447,301

(22) Filed: Nov. 23, 1999

(30) Foreign Application Priority Data

Nov. 27, 1998 (JP) ................. P10-337764

(51) Int. Cl.
*H04N 3/14* (2006.01)
*H04N 5/335* (2006.01)
(52) U.S. Cl. ..................... 348/311; 348/294
(58) Field of Classification Search ............... 348/321, 348/323, 283, 317, 311, 314, 322; 250/208.1; 257/234
See application file for complete search history.

(56) References Cited

U.S. PATENT DOCUMENTS

| | | | |
|---|---|---|---|
| 4,635,122 A * | 1/1987 | Kato et al. .................. 348/319 |
| 4,949,183 A * | 8/1990 | Stevens ...................... 348/323 |
| 5,196,939 A * | 3/1993 | Elabd et al. ................. 348/314 |
| 5,298,734 A * | 3/1994 | Kokubo ................... 250/208.1 |
| 5,387,935 A * | 2/1995 | Kobayashi .................. 348/323 |
| 5,812,192 A * | 9/1998 | Ishigami et al. ............ 348/321 |
| 6,028,299 A * | 2/2000 | Hirama et al. ........... 250/208.1 |
| 6,452,634 B1 * | 9/2002 | Ishigami et al. ............ 348/322 |
| 2002/0118291 A1 * | 8/2002 | Ishigami et al. ............ 348/311 |

* cited by examiner

*Primary Examiner*—Lin Ye
*Assistant Examiner*—James M. Hannett
(74) *Attorney, Agent, or Firm*—Robert J. Depke; Rockey, Depke & Lyons, LLC.

(57) ABSTRACT

The present invention relates to a solid-state image pickup device comprising a sensor array and a plurality of transfer registers for transferring signal charges from the sensors of the sensor array, wherein an accumulation gate is provided between the sensor array and the transfer registers for storing the signal charges from all the image sensors at a same time and subsequently allocating the signal charges to transfer registers. As a result, it is possible to provide a device capable of producing a higher-quality signal output by eliminating sensor to sensor variations in sensitivity and deviations in signal-charge fetching between sensors.

9 Claims, 12 Drawing Sheets

(t10)

(t11)

SOLID-STATE IMAGE-PICKUP DEVICE HAVING AN ACCUMULATION GATE FOR READING OUT, ACCUMULATING, AND ALLOCATING SIGNAL CHARGES

RELATED APPLICATION DATA

The present application claims priority to Japanese Application No. P10-337764 filed Nov. 27, 1998 which application is incorporated herein by reference to the extent permitted by law.

BACKGROUND OF THE INVENTION

The present invention relates to a solid-state image-pickup device including a plurality of transfer registers provided for an array of sensors and a method of driving the device.

FIG. 9 is a diagram showing a top view of a related art 1-line linear sensor in a simple and plain manner.

As shown in the figure, the related art linear sensor 50 comprises a sensor array 52, first and second CCD horizontal transfer registers 53 and 54, and a horizontal-horizontal transfer register 55. The sensor array 52 is a plurality of light receiving units 51, or a one-dimensional array of so-called sensor units 51 or opto-electrical conversion units 51. The light receiving units 51 each serve as a pixel.

Transfers of data in the horizontal CCD transfer registers 53 and 54 are 2-phase driven. To be more specific, horizontal drive pulse signals φ1 and φ2 are applied thereto.

In addition, a transfer pulse signal φHH is applied to the horizontal-horizontal transfer register 55.

A signal charge of an even pixel of a sensor unit 51 and a signal charge of an odd pixel of a sensor unit 51 are read out by read-out gates 56e and 56o, respectively which are controlled separately.

To be more specific, a read-out pulse signal φre is applied to the read-out gate 56e for an even pixel while a read-out pulse signal φro is applied to the read-out gate 56o for an odd pixel.

Typical transfer timings in this configuration are shown in FIG. 10.

First of all, when the read-out pulse signal φre is raised to a high level with the horizontal driving pulse signal φh1 set at the high level, the read-out gate 56e is opened to let a signal charge of an even pixel be transferred to the first horizontal CCD transfer register 53.

Next, when the horizontal driving pulse signal φh1 is set at a low level with the transfer pulse signal φHH raised at the high level, the signal charge of the even pixel is transferred from the first horizontal CCD transfer register 53 to the horizontal-horizontal transfer register 55.

Then, when the read-out pulse signal φro and the horizontal driving pulse signal φh2 are raised to the high level at the same time, the read-out gate 56o is opened to let a signal charge of an odd pixel be transferred to the first horizontal CCD transfer register 53.

At that time, since the transfer pulse signal φHH is further set at the low level while the horizontal driving pulse signal φh2 is raised to the high level simultaneously, the signal charge of the even pixel existing in the horizontal-horizontal transfer register 55 is transferred to a transfer unit of the second horizontal CCD transfer register 54, to which pulse signal φh2 is delivered.

Thereafter, normal transfers or horizontal CCD transfers are carried out by the first and second horizontal CCD transfer registers 53 and 54 by raising the 2-phase pulse signal, namely, the horizontal driving pulse signals φh1 and φh2, to a high level alternately to output the signal charges as a signal.

As described above, pixel signals stored in the sensor units 51 of the sensor array 52 are transferred by distributing the signals to a plurality of transfer units in the first and second horizontal CCD transfer registers 53 and 54. As a consequence, in order for the sensor array 52 to allocate the pixel signals to the transfer units, as many read-out gates 56e and 56o and as many read-out pulse signals φre and φro as transfer units of the first and second horizontal CCD transfer registers 53 and 54 are normally required.

In such the configuration of the linear sensor 50, however, timings of the read-out pulse signals φre and φro for reading out signal charges of even and odd pixels respectively are different. As a result, the time difference $\Delta T$ between the reading-out timings results in a difference $\Delta T$ in accumulation period between the signal charges.

In turn, the difference $\Delta T$ in accumulation period causes, among others, sensitivity varying from pixel to pixel and a deviation in signal-charge fetching between pixels.

In addition, since the read-out gates 56e and 56o are provided separately for the even and odd pixels respectively, the configuration of the read-out gates 56e and 56o and the driving pulse signals of the read-out gates 56e and 56o become complex.

SUMMARY OF THE INVENTION

It is thus an object of the present invention addressing the problems described above to provide a solid-state image-pickup device capable of producing a good signal output by eliminating variations in sensitivity from pixel to pixel and a deviation in signal-charge fetching between pixels and relates to a method of driving the solid-state image-pickup device.

The solid-state image-pickup device provided by the present invention comprises a sensor array comprising a plurality of sensors; and a plurality of transfer registers for transferring signal charges from said sensors of said sensor array, wherein an accumulation gate for reading out signal charges from said sensors at the same time, accumulating said signal charges and allocating said signal charges to said transfer registers is provided between said sensor array and said transfer registers.

The method of driving the solid-state image-pickup device provided by the present invention having a sensor array comprising a plurality of sensors; a plurality of transfer registers for transferring signal charges from said sensors of said sensor array; and an accumulation gate provided between said sensor array and said transfer registers, comprises the steps of: reading out signal charges from said sensors to said accumulation gate at the same time; allocating said signal charges of said sensors from said accumulation gate to said transfer registers; and driving said transfer registers to output said signal charges.

In the configuration of the solid-state image-pickup device provided by the present invention, there is provided an accumulation gates for reading out signal charges of sensors of a sensor array at the same time and for storing the signal charges therein, so that the signal charges of the sensors are stored for the same accumulation period as being read out at the same time. As a result, sensitivities of the sensors of the sensor array can be made uniform and a deviation in signal-charge fetching can be eliminated.

According to the method provided by the present invention as described above, signal charges of sensors of a sensor array are read out at the same time and the signal charges are stored in an accumulation gate simultaneously, so that the signal charges of the sensors are stored for the same accumulation period. As a result, sensitivities of the sensors of the sensor array can be made uniform and an operation to read out the signal charges without deviation can be carried out.

DESCRIPTION OF THE PREFERRED EMBODIMENTS

Hereinafter, preferred embodiments of the present invention will be described in detail with reference to the accompanying drawings.

The present invention is a solid-state image-pickup device comprising an array of sensors, an accumulation gate for reading out signal charges of the sensors and for storing the signal charges therein at the same time and a plurality of transfer registers, wherein the signal charges of the sensors are distributed among a plurality of transfer registers.

The solid-state image-pickup device provided by the present invention has a configuration wherein a read-out gate is provided between the array of sensors and the accumulation gate.

In addition, in the configuration of the solid-state image-pickup device provided by the present invention, the accumulation gates each set a difference in potential oriented in a direction of transfers of signal charges.

The present invention is a method of driving a solid-state image-pickup device by executing the steps of: reading out signal charges from sensors of a sensor array and storing the signal charges to an accumulation gate at the same time; reading out the signal charges of the sensors from the accumulation gate to distribute the signal charges among a plurality of transfer registers; and driving the transfer registers at the same time to output the signal charges of the sensor array from the transfer registers.

Figure 1:
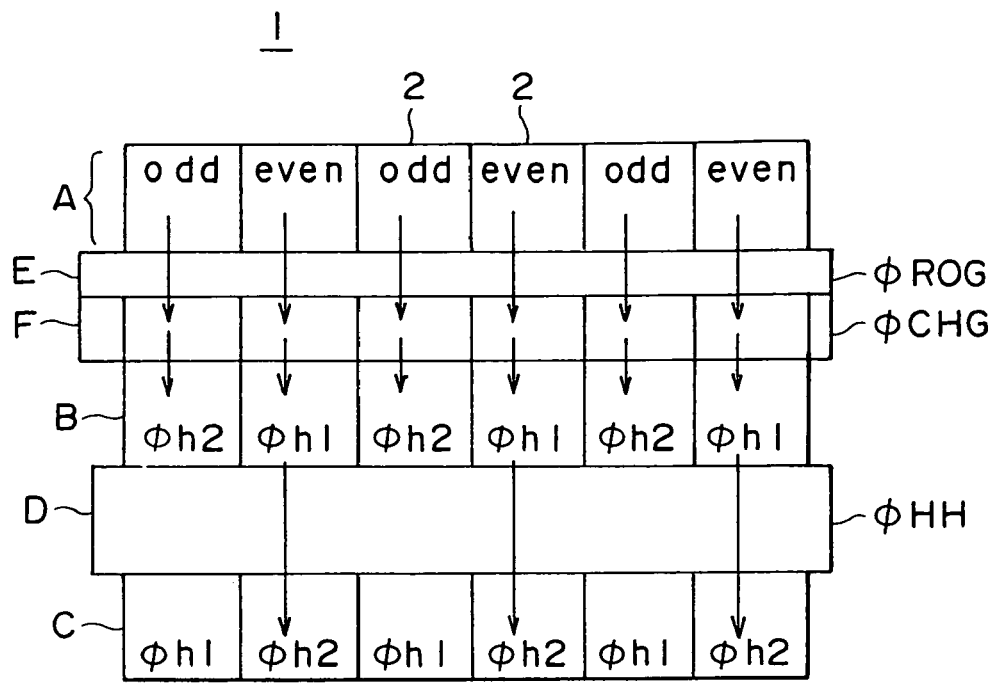
FIG. 1 is a schematic diagram showing a top view of an embodiment implementing a CCD linear sensor provided by the present invention.

FIG. 1 is a schematic diagram showing a top view of a CCD linear sensor implemented by an embodiment of the present invention.

To be more specific, FIG. 1 shows a 1-line CCD linear sensor.

As shown in the figure, a CCD linear sensor 1 comprises a sensor array A, two horizontal CCD transfer registers B and C, a horizontal-horizontal transfer register D, a read-out gate E and an accumulation gate F. The sensor array A is a plurality of light receiving units 2, or a one-dimensional array of so-called sensor units 2 or opto-electrical conversion units 2. The light receiving units 2 each serve as a pixel.

In the configuration, signal charges of even pixels of the sensor units 2 are transferred to the second horizontal transfer register C at the lower level. On the other hand, signal charges of odd pixels of the sensor units 2 are transferred to the first horizontal transfer register B at the higher level.

A read-out pulse signal φROG is applied to the read-out gate E and an accumulation pulse signal φCHG is applied to the accumulation gate F.

The first and second horizontal CCD transfer registers B and C are driven by 2-phase pulse signals, namely, horizontal driving pulse signals φh1 and φh2.

In addition, a transfer pulse signal φHH is applied to the horizontal-horizontal transfer register D.

It should be noted that the configuration of the CCD linear sensor 1 includes a potential barrier which is provided between the horizontal CCD transfer register B and the accumulation gates F, though not shown in the figure. In this configuration, when the accumulation pulse signal φCHG applied to the accumulation gate F and the horizontal driving pulse signal φh1 or φh2 applied to the first horizontal CCD register B are both set at a low level, a signal charge stored in an accumulation gate F can be prevented from flowing into the first horizontal CCD transfer register B.

Figure 2:
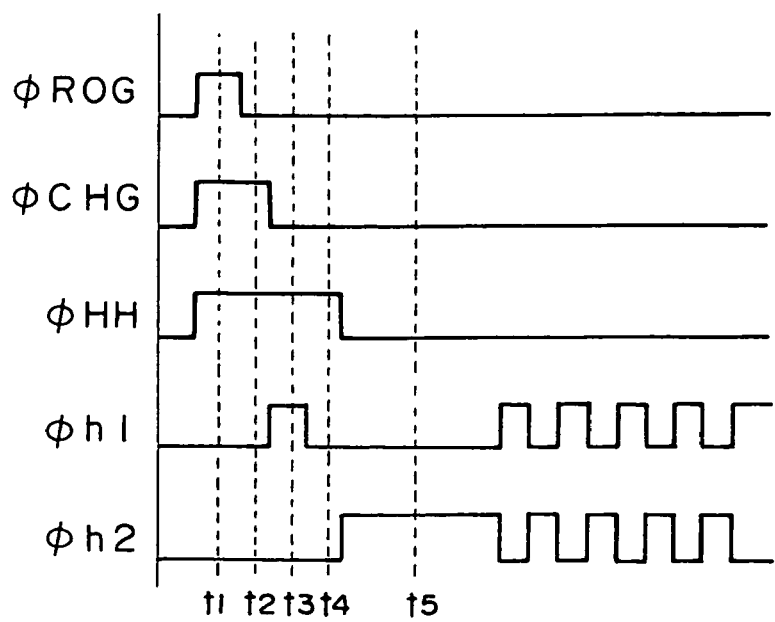
FIG. 2 is a diagram showing typical timings to drive the CCD linear sensor shown in FIG. 1.

An implementation of driving timing of the CCD linear sensor 1 having the configuration described above is shown in FIG. 2.

As shown in the figure, first of all, at a point of time $t_1$, the pulse signals φROG, φCHG and φHH have risen to the high level (ON-state), causing the read-out gate E to read out signal charges from the sensors 2 of the sensor array A and to the accumulation gate F at the same time.

At that time, the horizontal driving pulse signals φh1 and φh2 are both set at the low level.

Then, at a point of time $t_2$, the read-out pulse signal φROG of the read-out gate E is set at a low level, storing the signal charges read out from the sensors 2 into the accumulation gate F.

As described earlier, a potential barrier is provided between the first horizontal CCD transfer register B and the accumulation gate F, preventing the signal charges stored in the accumulation gate F from flowing into the first horizontal CCD transfer register B at this point of time.

Then, at a point of time $t_3$, the accumulation pulse signal φCHG of the accumulation gate F is set at a low level and then the horizontal driving pulse signal φh1 is raised to the high level. As a result, signal charges of even pixels stored in the accumulation gate F are transferred to the first horizontal CCD transfer register B.

Then, at a point of time $t_4$, with the transfer pulse signal φHH raised at a high level, the horizontal driving pulse signal φh1 is set at a low level. As a result, the signal charges of the even pixels are transferred from the first horizontal CCD transfer register B to the horizontal-horizontal transfer register D.

Finally, at a point of time $t_5$, the transfer pulse signal φHH of the horizontal-horizontal transfer register D is set at a low level while the horizontal driving pulse signal φh2 is raised at a high level. As a result, the signal charges of the even pixels are transferred from the horizontal-horizontal transfer register D to the second horizontal CCD transfer register C at the lower level and signal charges of odd pixels stored in the accumulation gate F are transferred to the first horizontal CCD transfer register B.

Thereafter, normal horizontal CCD transfer registers are carried out by setting the 2-phase pulse signal, namely, the horizontal driving pulse signals φh1 and φh2, alternately to output the signal charges as a signal switching from high level to low level.

With driving timings described above adopted in the configuration of the CCD linear sensor 1, signal charges of pixels are read out from the sensors 2 of the sensor array A with the same timing, being stored into the accumulation gate F, so that the accumulation periods of the signal charges in the accumulation gate F are equal. As a result, there are no longer conventional problems such as sensitivity variations from pixel to pixel and deviations in signal-charge fetching between pixels.

In the embodiment shown in FIG. 1, signal charges are transferred from the sensor array A of the CCD linear sensor 1 to the two horizontal CCD transfer registers B and C. It should be noted, however, that three horizontal CCD transfer registers can also be employed. In this case, 3-phase pulse signals are used to drive the horizontal-horizontal transfer register D. In general, as many phases as horizontal CCD transfer registers are used for horizontal-horizontal driving. By applying driving timings of a plurality of phases such as 3, 4 and so on, phases, equal to the number of the transfer resisters, the same transfers can be carried out.

In addition, the driving technique described above can also be applied to a configuration wherein signal charges of at least two sensor arrays are transferred and distributed to a plurality of horizontal transfer registers as is the case with a 3-line color linear sensor for example. Moreover, the driving technique described above can also be applied to a configuration wherein transfer registers are provided above and below an array of sensors.

Figure 3:
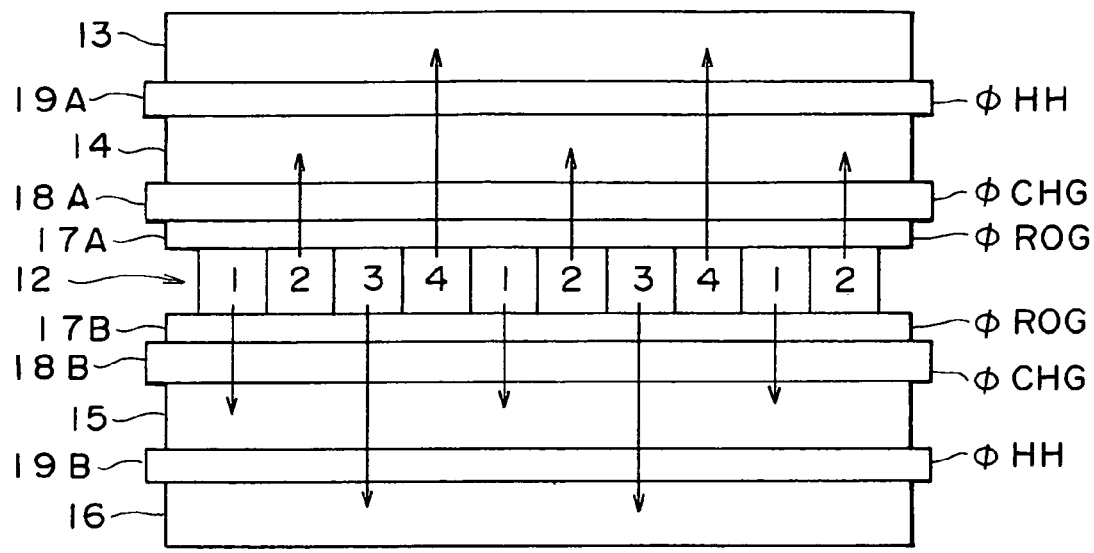
FIG. 3 is a schematic diagram showing a top view of an embodiment implementing a two-side read-out CCD linear sensor.

FIG. 3 is a diagram showing a top view of an embodiment implementing the so-called two-side read-out CCD linear sensor wherein horizontal CCD transfer registers are provided above and below an array of sensors in a simple and plain manner.

In the CCD linear sensor 11 shown in FIG. 3, two of the horizontal CCD transfer registers 13 and 14 are provided above a sensor array 12. On the other hand, horizontal CCD transfer registers 15 and 16 are provided below the sensor array 12.

Read-out gates 17A and 17B are provided above and below the sensor array 12, respectively.

Between the read-out gate 17A and the horizontal CCD register 14 on the inner side, an accumulation gate 18A is provided. By the same token, between the read-out gate 17B and the horizontal CCD register 15, an accumulation gate 18B is provided.

Between the horizontal CCD transfer registers 13 and 14 above the sensor array 12, a horizontal-horizontal transfer register 19A is provided. By the same token, between the horizontal CCD transfer registers 15 and 16 below the sensor array 12, a horizontal-horizontal transfer register 19B is provided.

The read-out gates 17A and 17B, the accumulation gates 18A and 18B and the horizontal-horizontal transfer registers 19A and 19B, each provided on the two sides of the sensor array 12 are driven by a common read-out pulse signal φROG, a common accumulation pulse signal φCHG and a common transfer pulse signal φHH, respectively.

In the CCD linear sensor 11, every set of four pixels each serving as the so-called sensor on the sensor array 12 are denoted by reference numerals 1, 2, 3 and 4. The four pixels 1, 2, 3 and 4 in each set are allocated and transferred to the four horizontal CCD transfer registers 13, 14, 15 and 16, respectively, two of them are provided above the sensor array 12 and the remaining two are provided below the sensor array 12 as described above.

To be more specific, a signal charge of the pixel 1 is transferred to the horizontal CCD transfer register 15 right below the sensor array 12 and a signal charge of the pixel 2 is transferred to the horizontal CCD transfer register 14 right above the sensor array 12. On the other hand, a signal charge of the pixel 3 is transferred to the horizontal CCD transfer register 16 far below the sensor array 12 and a signal charge of the pixel 4 is transferred to the horizontal CCD transfer register 13 far above the sensor array 12.

Then, by carrying out horizontal driving based on 2-phase or 4-phase, signal charges in the horizontal CCD transfer registers 13, 14, 15 and 16 can be output.

It should be noted that allocation of signal charges of pixels 1, 2, 3 and 4 to the horizontal CCD transfer registers 13, 14, 15 and 16 is not limited to what is described above. Other combinations can also be adopted as well.

It is worth noting that it is also possible to design a configuration wherein the read-out gates 17A and 17B, the accumulation gates 18A and 18B and the horizontal-horizontal transfer registers 19A and 19B, each provided on the two sides of the sensor array 12 are driven by different driving pulse signals, such as read-out pulse signals φROG, accumulation pulse signals φCHG and transfer pulse signals φHH, respectively.

As shown in FIG. 3, however, by driving the read-out gates 17A and 17B, the accumulation gates 18A and 18B and the horizontal-horizontal transfer registers 19A and 19B, each provided on the two sides of the sensor array 12 by common driving pulse signals, that is, a common read-out pulse signal φROG, a common accumulation pulse signal φCHG and a common transfer pulse signal φHH respectively, signal charges of pixels 1, 2, 3 and 4 can be allocated to a plurality of horizontal CCD transfer registers, that is, the horizontal CCD transfer registers 13, 14, 15 and 16, the configuration using common driving pulse signals to drive the read-out gates 17A and 17B, the accumulation gates 18A and 18B and the horizontal-horizontal transfer registers 19A and 19B is desirable since such a configuration makes the structure of the CCD linear sensor 11 simple.

Figure 4:
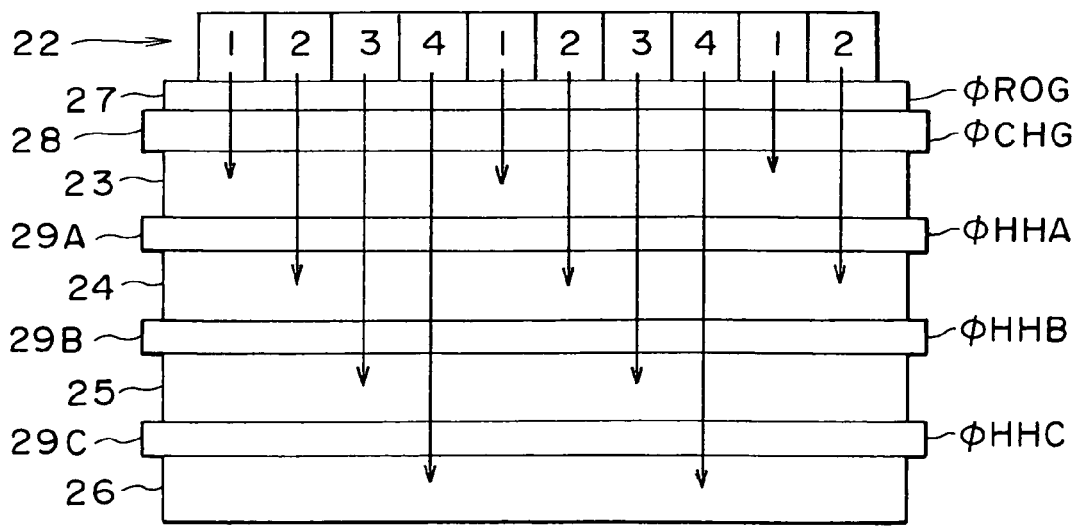
FIG. 4 is a schematic diagram showing a top view of an embodiment implementing a CCD linear sensor, in which four horizontal CCD transfer registers are provided on one side of an array of sensors.

FIG. 4 is a diagram showing a top view of an embodiment implementing a one-side read-out CCD linear sensor wherein four horizontal CCD transfer registers are provided on one side of an array of sensors in a simple and plain manner.

The CCD linear sensor 21 shown in FIG. 4 includes: four horizontal CCD transfer registers 23, 24, 25 and 26 provided on one side (lower side in FIG. 4) of a sensor array 22; a read-out gate 27 adjacent to the sensor array 22 on the lower side thereof; an accumulation gate 28 between the CCD transfer register 23 and the read-out gate 27; and three horizontal-horizontal transfer registers 29A, 29B and 29C among the four horizontal CCD transfer registers 23, 24, 25 and 26, that is, the horizontal-horizontal transfer register 29A between the horizontal CCD transfer registers 23 and 24, the horizontal-horizontal transfer register 29B between the horizontal CCD transfer registers 24 and 25 and the horizontal-horizontal transfer register 29C between the horizontal CCD transfer registers 25 and 26.

A read-out pulse signal φROG is applied to the read-out gate 27 and an accumulation pulse signal φCHG is applied to the accumulation gate 28.

The three horizontal-horizontal transfer registers 29A, 29B and 29C are driven by transfer pulse signals φHHA, φHHB and φHHC which are different from each other to serve as a 3-phase pulse signal implementing horizontal-horizontal transfers of signal charges.

In the CCD linear sensor 21, every set of four pixels of the sensor array 22 are denoted by reference numerals 1, 2, 3 and 4. The 4 pixels 1, 2, 3 and 4 in each set are allocated and transferred to the four horizontal CCD transfer registers 23, 24, 25 and 26, respectively.

To be more specific, the signal charge of the pixel 1 is transferred to the horizontal CCD transfer register 23 immediately below the sensor array 22 and the signal charge of the pixel 2 is transferred to the horizontal CCD transfer register 24 below the horizontal CCD transfer register 23. On the other hand, the signal charge of the pixel 3 is transferred to the horizontal CCD transfer register 25 below the horizontal CCD transfer register 24 and the signal charge of the pixel 4 is transferred to the horizontal CCD transfer register 26 at the lowest level below the horizontal CCD transfer register 25.

In addition, allocation of signal charges of pixels to a plurality of horizontal CCD transfer registers is not limited to the technique using an accumulation gate as is the case with the embodiments described above. Instead, signal charges of pixels can be allocated to the horizontal CCD transfer registers by using horizontal-horizontal transfer registers in the same configurations.

Figure 5:
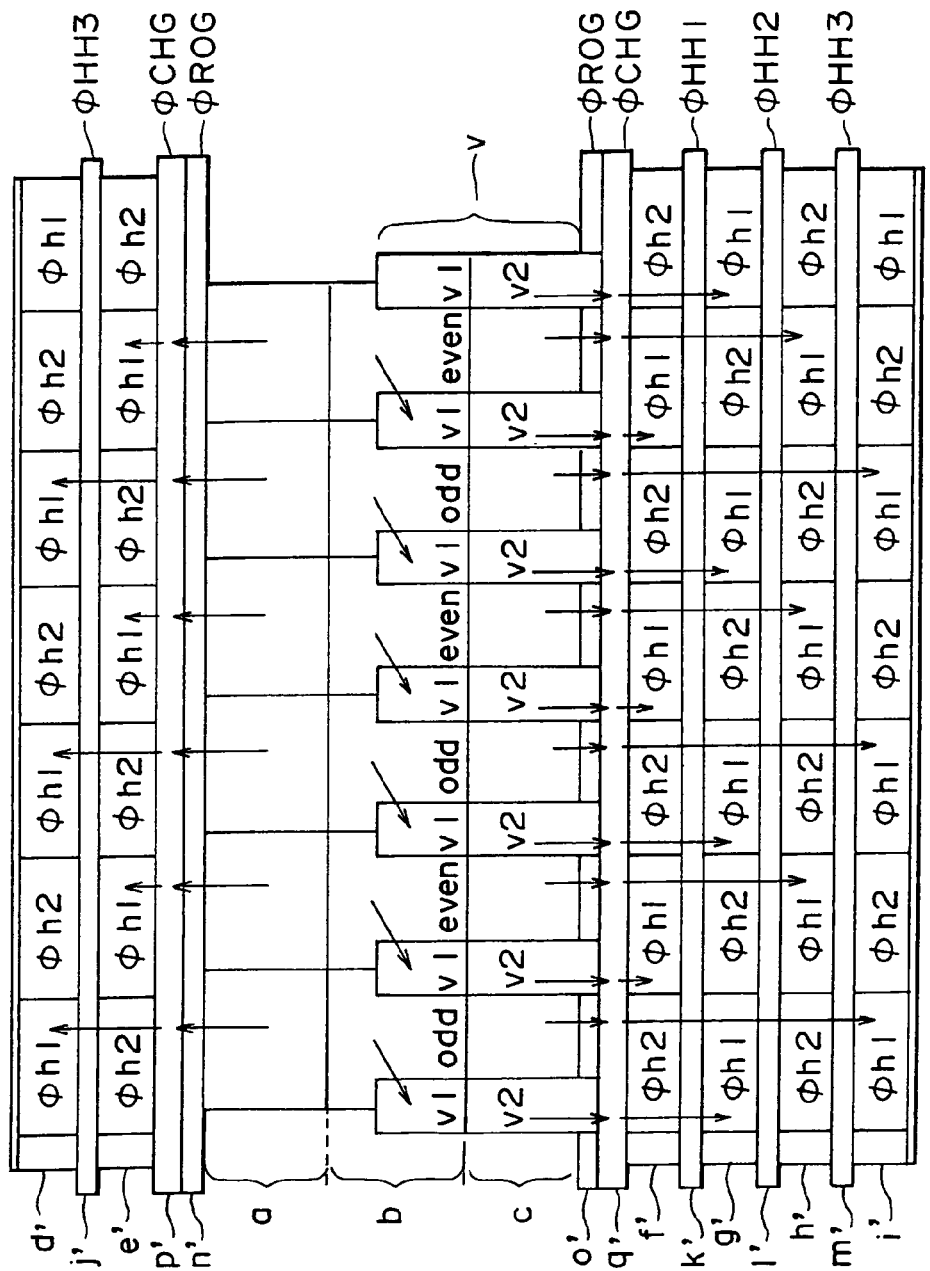
FIG. 5 is a schematic diagram showing a top view of another embodiment implementing a 3-line CCD linear sensor provided by the present invention.

FIG. 5 is a diagram showing a top view of still another embodiment of the present invention implementing a 3-line CCD linear sensor in a simple and plain manner.

As shown in the figure, the CCD linear sensor 31 includes sensor arrays a, b and c provided sequentially and adjacently to each other for typically the R (red), G (green) and B (blue) primary colors; horizontal CCD transfer registers d' and e' adjacent to the sensor array a and respectively used for receiving and transferring signal charges of odd and even pixels implemented by sensors of the sensor array a; horizontal CCD transfer registers f' and g' adjacent to the sensor array c and respectively used for receiving and transferring signal charges of odd and even pixels implemented by sensors of the sensor array b; and horizontal CCD transfer registers h' and i' adjacent to the horizontal CCD transfer register g' and respectively used for receiving and transferring signal charges of odd and even pixels implemented by sensors of the sensor array c.

In addition, the CCD linear sensor 31 implemented by this embodiment further has a vertical register v for transferring signal charges of pixels of the sensor array b located between the sensors arrays a and c to the horizontal CCD transfer registers f' and g'; a horizontal-horizontal transfer register j' provided between the horizontal CCD transfer registers d' and e'; a horizontal-horizontal transfer register k' provided between the horizontal CCD transfer registers f' and g'; a horizontal-horizontal transfer register l' provided between the horizontal CCD transfer registers g' and h'; and a horizontal-horizontal transfer register m' provided between the horizontal CCD transfer registers h' and i'.

The horizontal CCD transfer registers d', e', f', g', h' and i' are each driven by 2-phase horizontal driving pulse signals φh1 and φh2 to transfer signal charges sequentially in the horizontal direction.

In addition, the horizontal-horizontal transfer register k' is driven by a transfer pulse signal φHH1, the horizontal-horizontal transfer register l' is driven by a transfer pulse signal φHH2, the horizontal-horizontal transfer register m' and the horizontal-horizontal transfer register j' are driven by a transfer pulse signal φHH3 to control flows of signal charges between the horizontal CCD transfer registers d', e', f', g', h' and i'.

A read-out gate n' is provided between pixels of the sensor array a and the horizontal CCD transfer register e' and a read-out gate o' is provided between pixels of the sensor array c and the horizontal CCD transfer register f'. The read-out gates n' and o' are driven by a read-out pulse signal φROG to transfer signal charges of pixels to the horizontal CCD transfer registers e', d', h' and i'.

In addition, 2-phase vertical driving pulse signals φV1 and φV2 are applied to the vertical register v to transfer signal charges of odd and even pixels of the sensor array b to the horizontal CCD transfer registers f' and g'.

Then, much like the embodiments described previously, this embodiment has a configuration similar to the other embodiments stated before wherein, in particular, an accumulation gate p' is provided between the transfer gate n' adjacent to pixels of the sensor array a and the horizontal CCD transfer register e', and an accumulation gate q' is provided between the transfer gate o' adjacent to pixels of the sensor array c and the horizontal CCD transfer register f'. By applying an accumulation pulse signal φCHG to the accumulation gates p' and q', signal charges transferred from the read-out gates n' and o' and the vertical register v are stored temporarily in the accumulation gates p' and q'.

As described above, also in the case of the CCD linear sensor 31 implemented by this embodiment, the accumulation gates p' and q' are provided as is the case with the embodiments explained previously. Thus, signal charges read out from sensors serving as pixels of the same sensor array at the same time are stored temporarily in the accumulation gates p' and q'. As a result, the accumulation periods of signal charges of pixels of the same sensor array are equal without regard to whether the sensor array is the sensor array a, b or c.

In addition, also in the case of this embodiment, a potential barrier is provided between the accumulation gate p' and the horizontal CCD transfer register e'. By the same token, a potential barrier is provided between the accumulation gate q' and the horizontal CCD transfer register f'.

Furthermore, it is desirable to raise an electric potential at a portion on the sensor side in each of the horizontal CCD transfer registers d', e', f', g', h' and i' to prevent a signal charge from flowing into a sensor side.

It is desirable to arrange the three sensor arrays a, b and c at locations adjacent to each other. It should be noted, however, that they do not have to be arranged at locations adjacent to each other. For example, the sensors arrays a, b and c can be arranged at locations separated from each other by two to three lines.

Figure 6A:
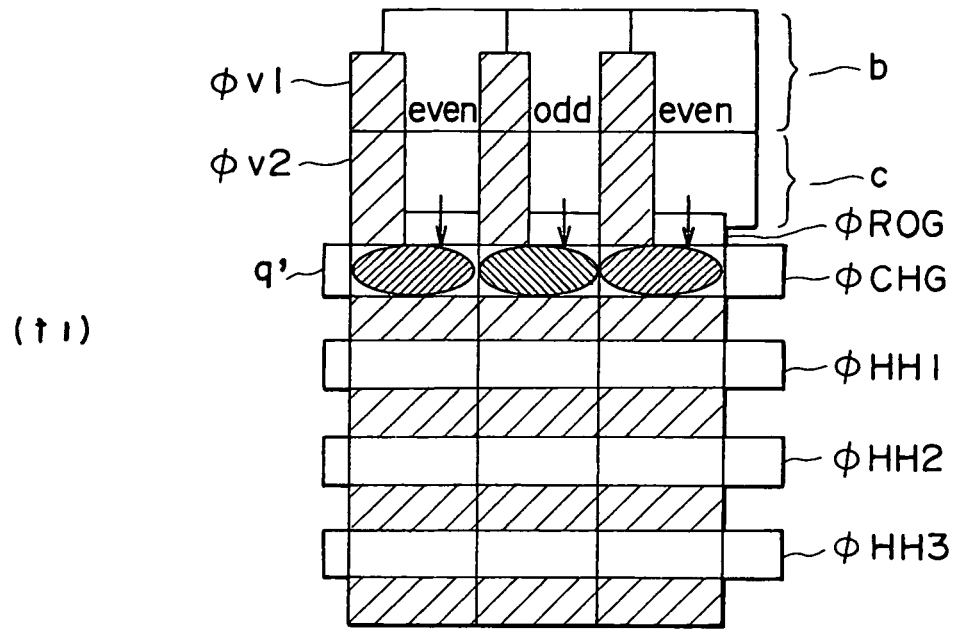
FIGS. 6A to 6L are explanatory diagrams each showing a top view of main elements of the CCD linear sensor shown in FIG. 5 in a state of transferring signal charges in a simple and plain manner.

Next, a concrete driving method of the CCD linear sensor 31 is explained. FIGS. 6A to 6L are diagrams showing top views of principal elements involved in sequential transfers of signal charges in a simple and plain manner. FIG. 7 shows timing charts of the transfers.

FIGS. 6A to 6L are diagrams showing transfers of signal charges stored in the sensor arrays b and c. In the figure, a signal charge is expressed by an ellipse. A hatched portion represents a portion at a low level or an OFF-state.

First of all, at a point of time $t_1$ shown in FIG. 7, the pulse signals φh1, φh2, φV1 and φV2 are set at a low level while the pulse signals φROG, φCHG, φHH1, φHH2 and φHH3 are raised to a high level. In this state, signal charges are transferred from pixels of the sensor array c to the accumulation gate q' as shown in FIG. 6A.

It should be noted that, by raising the read-out pulse signal φROG to a high level at that time, signal charges are transferred from pixels of the sensor array a to the accumulation gate p' as shown in FIG. 5.

Next, when only the read-out pulse signal φROG changes from the high level to a low level at a point of time $t_2$, signal charges left in the read-out gate o' are also transferred to the accumulation gate q'. It should be noted that, at that time, signal charges left in the read-out gate n' shown in FIG. 5 are also transferred to the accumulation gate p'.

Figure 6B:
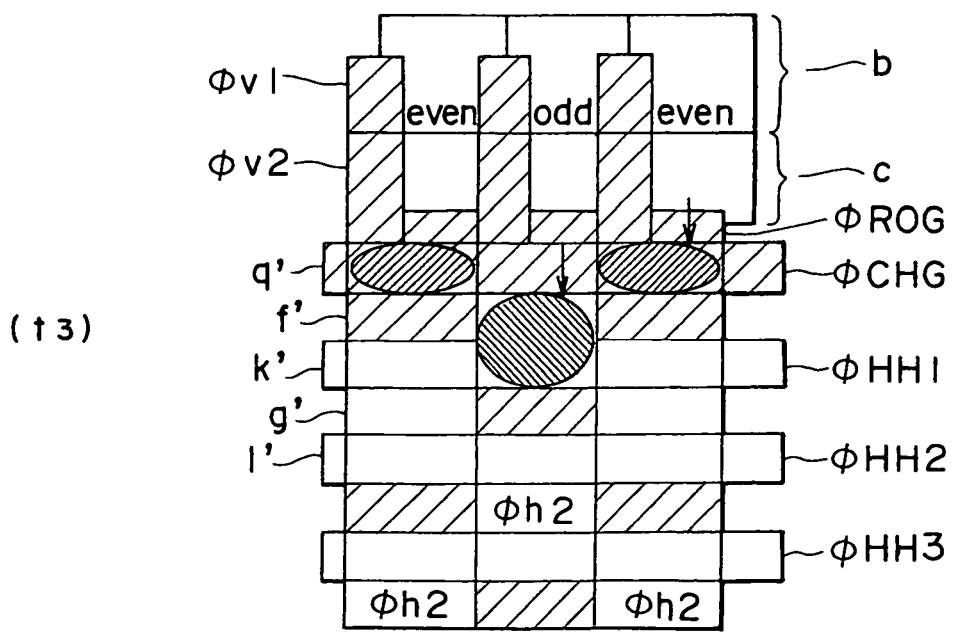
Figure 7:
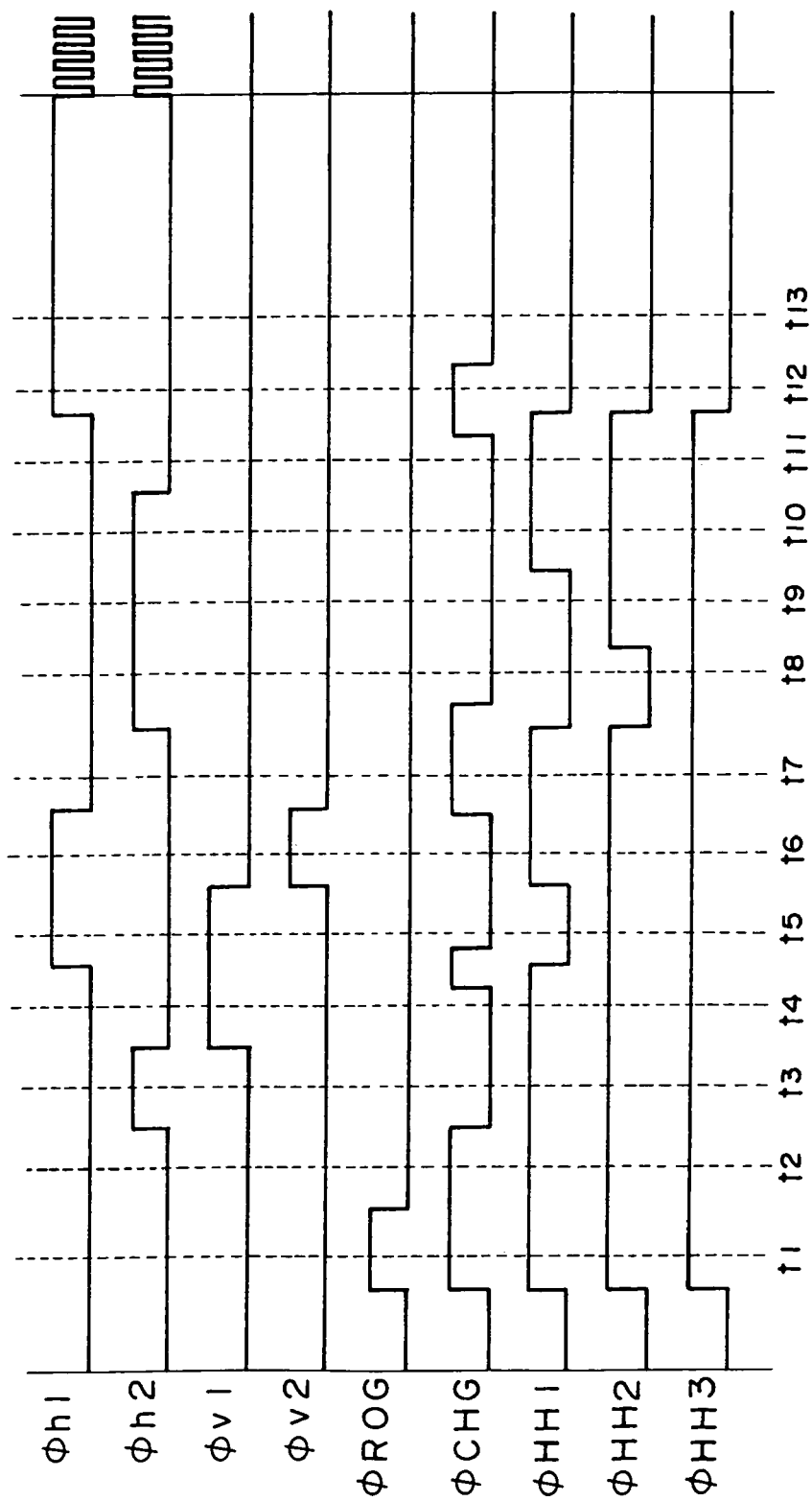
FIG. 7 is a timing chart showing typical timings to drive the CCD linear sensor shown in FIG. 5.

Then, at a point of time $t_3$, when the horizontal driving pulse signal φh1 is set at a low level, the horizontal driving pulse signal φh2 is raised to a high level, the vertical driving pulse signal φV1 is set at a low level, the vertical driving pulse signal φV2 is set at a low level, the read-out pulse signal φROG is set at a low level, the accumulation pulse signal φCHG is set at a low level and the transfer pulse signals φHH1, φHH2 and φHH3 are raised to a high level, signal charges of odd pixels of the sensor array c are transferred from the accumulation gate q' to the horizontal-horizontal transfer register k' as shown in FIG. 6B. Since the horizontal driving pulse signal φh2 is at a high level at that time, in some cases, signal charges of odd pixels of the sensor array c may also exist in the horizontal CCD transfer register f'.

Since the horizontal driving pulse signal φh1 is at a low level and a potential barrier exists between the accumulation gate q' and the horizontal CCD transfer register f', on the other hand, signal charges of even pixels of the sensor array c remain continuously in the accumulation gate q', even if the accumulation gate q' is set at a low level.

It should be noted that, by setting the accumulation pulse signal φCHG at a low level and raising the pulse signals φh2 and φHH3 to a high level at that time, signal charges of odd pixels of the sensor array a shown in FIG. 5 are transferred from the accumulation gate p' to the horizontal CCD transfer register e'.

Since a potential barrier exists due to the horizontal driving pulse signal φh1 reset at a low level, on the other hand, signal charges of even pixels of the sensor array a remain continuously in the accumulation gate p'.

Figure 6C:
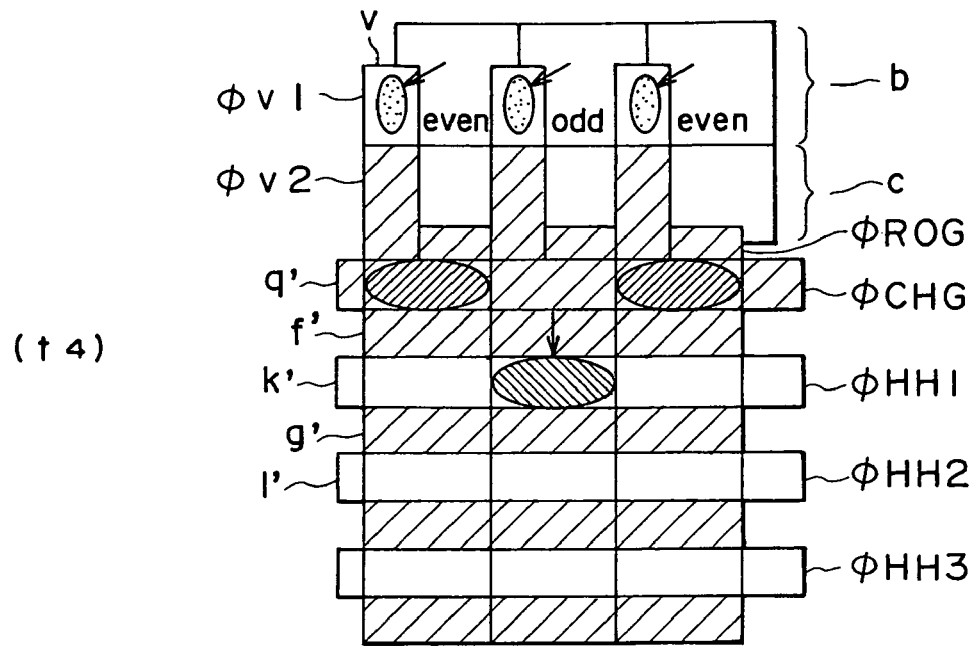

Then, at a point of time $t_4$, when the horizontal driving pulse signal φh1 is set at a low level, the horizontal driving pulse signal φh2 is set at a low level, the vertical driving pulse signal φV1 is raised to a high level, the vertical driving pulse signal φV2 is set at a low level, the read-out pulse signal φROG is set at a low level, the accumulation pulse signal φCHG is set at a low level and the transfer pulse signals φHH1, φHH2 and φHH3 are raised to a high level, signal charges of pixels of the sensor array b are transferred to an upper stage V1 of the vertical register v as shown in FIG. 6C.

It should be noted that, signal charges of odd pixels of the sensor array c left in the horizontal CCD transfer register f', if any, are transferred to the horizontal-horizontal transfer register k'.

It is also worth noting, that by setting the horizontal driving pulse signal φh2 at a low level at that time, signal charges of odd pixels of the sensor array a shown in FIG. 5 are transferred from the horizontal CCD transfer register e' to the horizontal-horizontal transfer register j'.

Figure 6D:
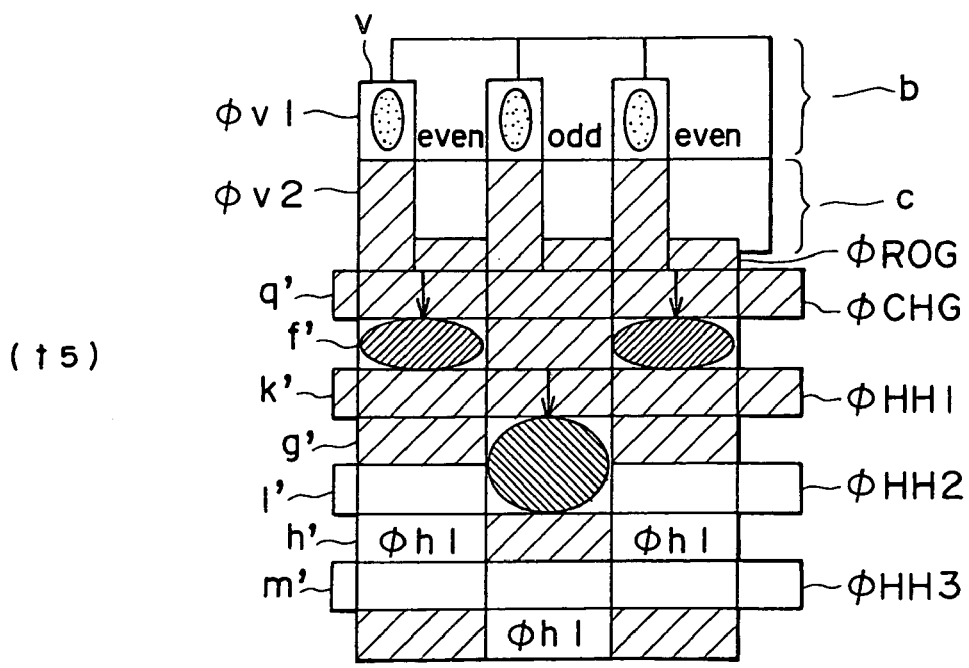

Then, at a point of time $t_5$, when the horizontal driving pulse signal φh1 is raised to a high level, the horizontal driving pulse signal φh2 is set at a low level, the vertical driving pulse signal φV1 is raised to a high level, the vertical driving pulse signal φV2 is set at a low level, the read-out pulse signal φROG is set at a low level, the accumulation pulse signal φCHG is set at a low level and the transfer pulse signal φHH1 is set at a low level and the transfer pulse signals φHH2 and φHH3 are raised to a high level, signal charges of odd pixels of the sensor array c are transferred from the horizontal-horizontal transfer register k' to the horizontal-horizontal transfer register l' as shown in FIG. 6D. Since the horizontal driving pulse signal φh1 is at a high level at that time, in some cases, signal charges of odd pixels of the sensor array c may also exist in the horizontal CCD transfer register g'.

On the other hand, signal charges of even pixels of the sensor array c are transferred from the accumulation gate q' to the horizontal CCD transfer register f'.

It should be noted that, since the horizontal driving pulse signal φh1 is at a high level at that time, signal charges of odd pixels of the sensor array a are transferred from the horizontal-horizontal transfer register j' to the horizontal CCD transfer register d'.

In addition, signal charges of even pixels of the sensor array a are transferred from the accumulation gate p' to the horizontal CCD transfer register e'.

Figure 6E:
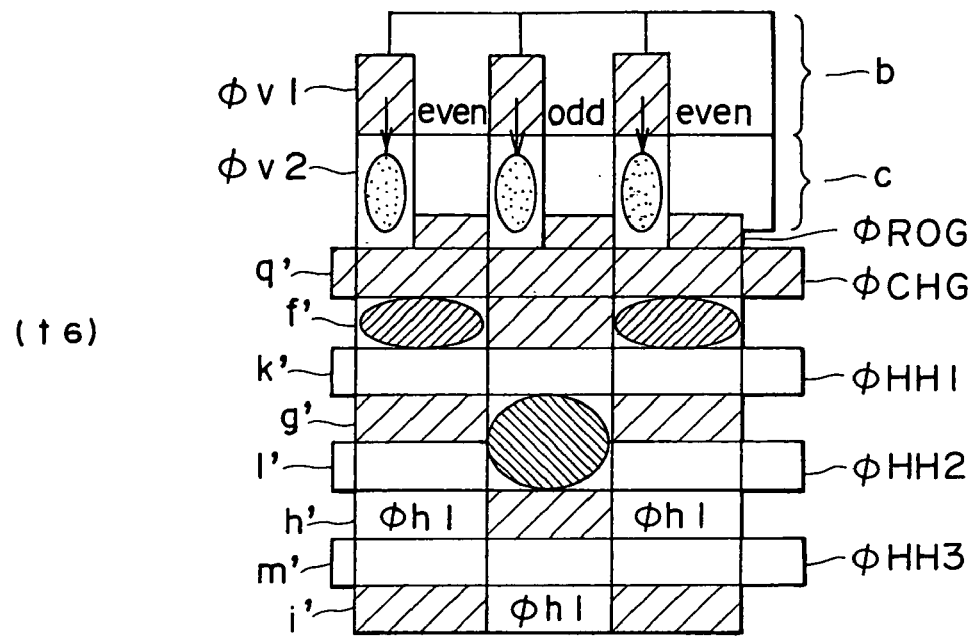

Then, at a point of time $t_6$, when the horizontal driving pulse signal φh1 is raised to a high level, the horizontal driving pulse signal φh2 is set at a low level, the vertical driving pulse signal φV1 is set to a low level, the vertical driving pulse signal φV2 is raised to a high level, the read-out pulse signal φROG is set at a low level, the accumulation pulse signal φCHG is set at a low level and the transfer pulse signals φHH1, φHH2 and φHH3 are raised to a high level, signal charges of pixels of the sensor array b are transferred from the upper stage V1 to a lower stage V2 of the vertical register v as shown in FIG. 6E.

Figure 6F:
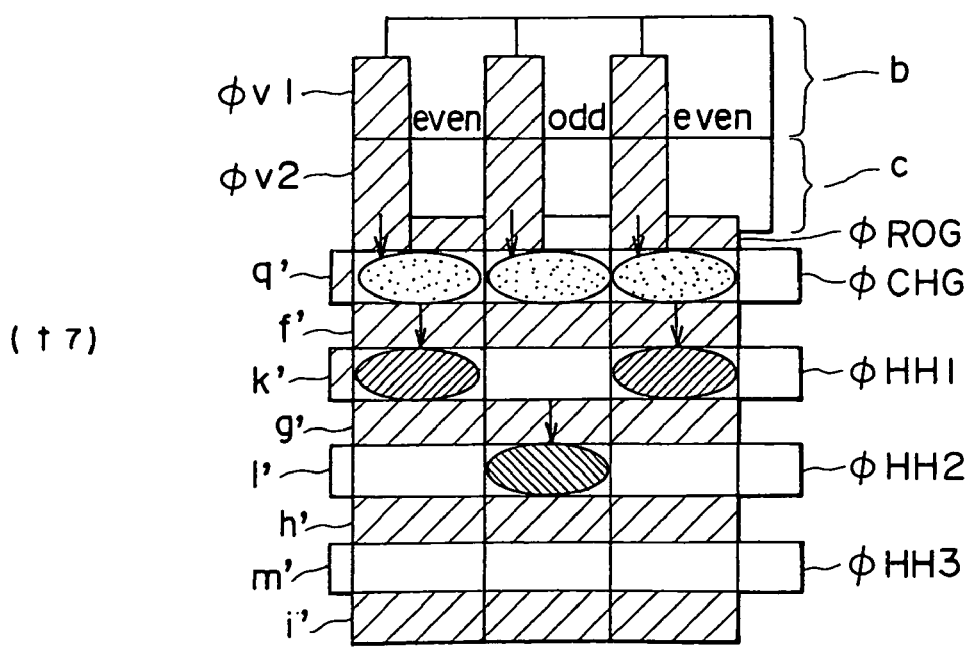

Then, at a point of time $t_7$, when the horizontal driving pulse signal φh1 is set at a low level, the horizontal driving pulse signal φh2 is set at a low level, the vertical driving pulse signal φV1 is set at a low level, the vertical driving pulse signal φV2 is set at a low level, the read-out pulse signal φROG is set at a low level, the accumulation pulse signal φCHG is raised to a high level and the transfer pulse signals φHH1, φHH2 and φHH3 are raised to a high level, signal charges of pixels of the sensor array b are transferred from the lower stage V2 of the vertical register v to the accumulation gate q' as shown in FIG. 6F.

In addition, signal charges of even pixels of the sensor array c are transferred from the horizontal CCD transfer register f' to the horizontal-horizontal transfer register k'.

It should be noted that, signal charges of odd pixels of the sensor array c left in the horizontal CCD transfer register g', if any, are transferred to the horizontal-horizontal transfer register l'.

It should be noted, that by setting the horizontal driving pulse signal φh1 at a low level at that time, signal charges of odd pixels of the sensor array a are transferred from the horizontal CCD transfer register d' to the horizontal-horizontal transfer register j'.

In addition, signal charges of even pixels of the sensor array a are also transferred from the horizontal CCD transfer register e' to the horizontal-horizontal transfer register j'.

Figure 6G:
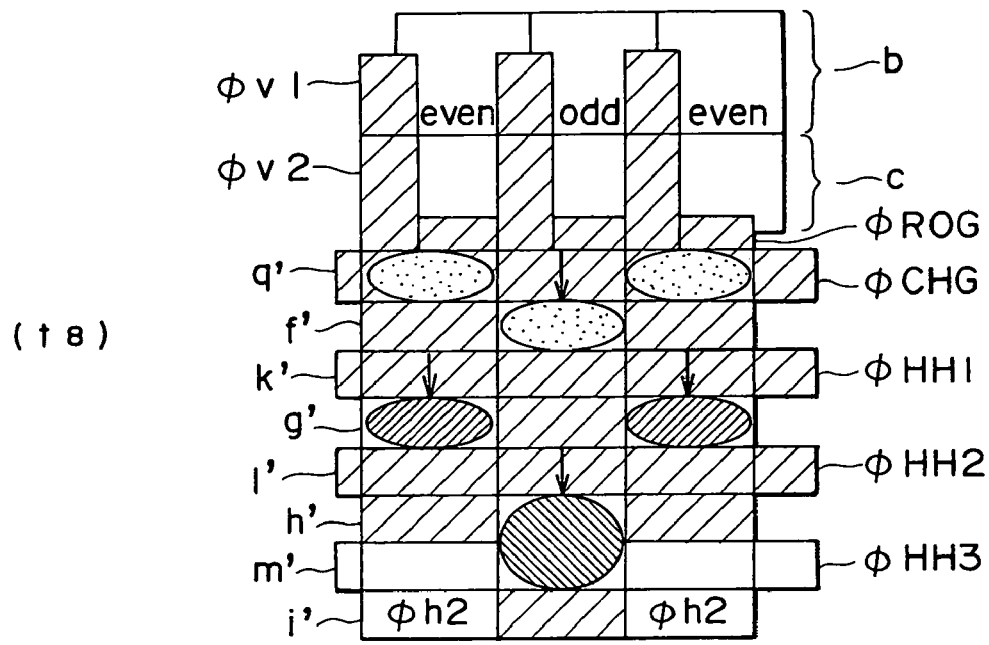

Then, at a point of time $t_8$, when the horizontal driving pulse signal φh1 is set at a low level, the horizontal driving pulse signal φh2 is raised to a high level, the vertical driving pulse signal φV1 is set at a low level, the vertical driving pulse signal φV2 is set at a low level, the read-out pulse signal φROG is set at a low level, the accumulation pulse signal φCHG is set at a low level and the transfer pulse signals φHH1 and φHH2 are set at a low level and the transfer pulse signal φHH3 are raised to a high level, signal charges of odd pixels of the sensor array c are transferred from the horizontal-horizontal transfer register l' to the horizontal-horizontal register m' as shown in FIG. 6G. Since the horizontal driving pulse signal φh2 is at a high level at that time, signal charges of odd pixels of the sensor array c may also exist in the horizontal CCD transfer register h' in some cases.

In addition, signal charges of even pixels of the sensor array c are transferred from the horizontal-horizontal transfer register k' to the horizontal CCD transfer register g'.

Then, by raising the horizontal driving pulse signal φh2 to a high level, signal charges of odd pixels of the sensor array b are transferred from the accumulation gate q' to the horizontal CCD transfer register f'.

Since a potential barrier exists due to the horizontal driving pulse signal φh1 reset at a low level, on the other hand, signal charges of even pixels of the sensor array b remain continuously in the accumulation gate q'.

It should be noted that, by raising the horizontal driving pulse signal φh2 to a high level at that time, signal charges of odd pixels of the sensor array a are transferred from the horizontal-horizontal transfer register j' to the horizontal CCD transfer register e'.

In addition, signal charges of even pixels of the sensor array a are also transferred from the horizontal-horizontal transfer register j' to the horizontal CCD transfer register d'.

Figure 6H:
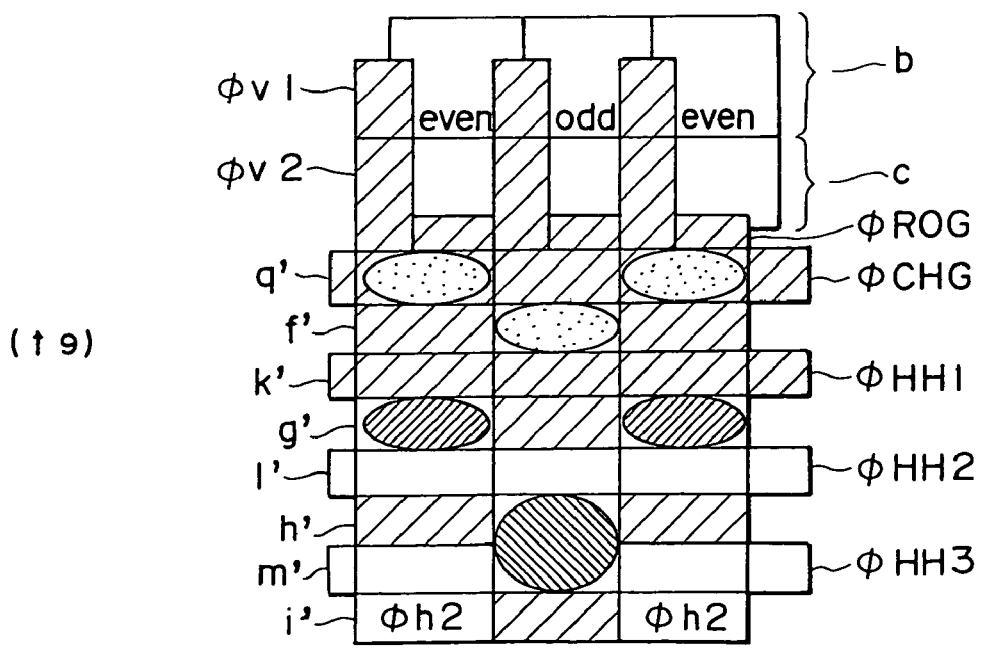

Then, at a point of time $t_9$, as shown in FIG. 6H, when the transfer pulse signal φHH2 is changed to a high level, signal charges basically remain at the same locations as shown in FIG. 6G. Since the horizontal-horizontal transfer registers are normally driven to an electric potential lower than the horizontal CCD transfer registers, however, signal charges of even pixels of the sensor array c flow from the horizontal CCD transfer register g' to the horizontal-horizontal transfer register l'.

Figure 6I:
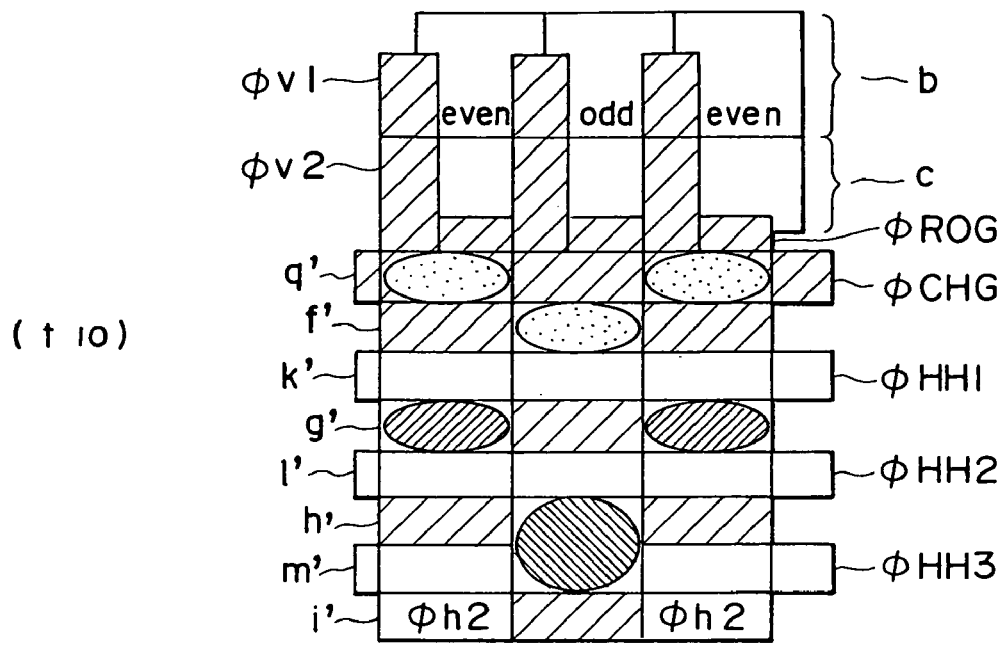
Figure 6J:
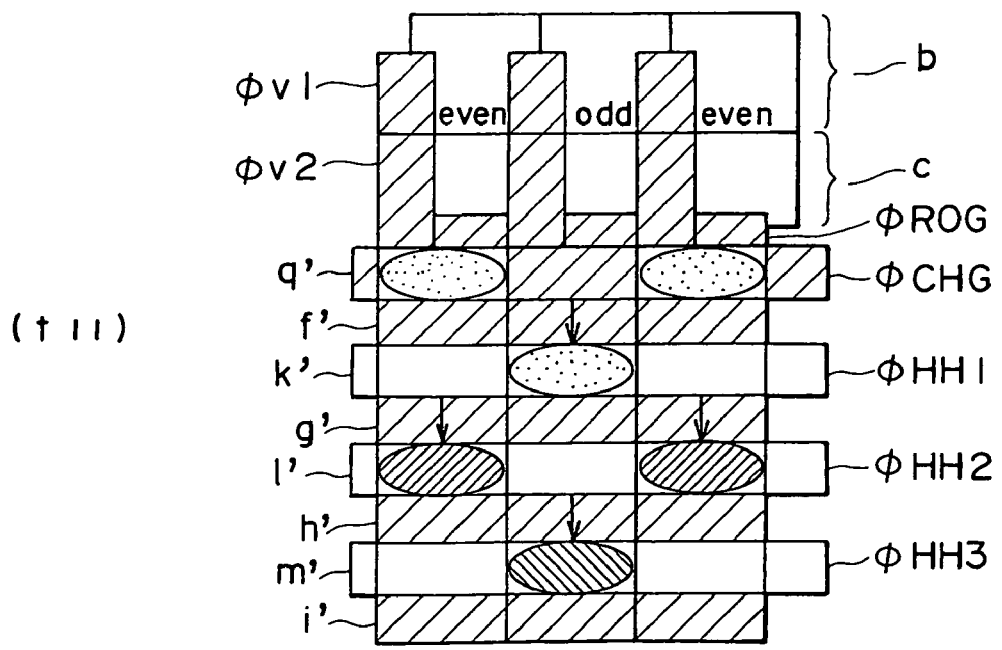

Then, at a point of time $t_{10}$, as shown in FIG. 6I, when the transfer pulse signal φHH1 is changed to a high level, signal charges basically remain at the same locations shown in FIGS. 6G and 6H. In some cases, however, signal charges of odd pixels of the sensor array b flow from the horizontal CCD transfer register f' to the horizontal-horizontal transfer register k'.

In addition, by making an electric potential at a portion on the sensor side in each of the horizontal CCD transfer registers shallow as described above, signal charges of odd pixels of the sensor array c can be prevented from flowing from the horizontal CCD transfer register g' to the horizontal-horizontal transfer register k' on the sensor side, even if the transfer pulse signal φHH1 is at a high level at the point of time $t_{10}$. It is thereby possible to prevent signal charges of odd pixels of the sensor array c from mixing with signal charges of odd pixels of the sensor array b.

Then, at a point of time $t_{11}$, when the horizontal driving pulse signal φh1 is set at a low level, the horizontal driving pulse signal φh2 is set at a low level, the vertical driving pulse signal φV1 is set at a low level, the vertical driving pulse signal φV2 is set at a low level, the read-out pulse signal φROG is set at a low level, the accumulation pulse signal φCHG is set at a low level and the transfer pulse signals φHH1, φHH2 and φHH3 are raised to a high level, signal charges of even pixels of the sensor array c are transferred from the horizontal CCD transfer register g' to the horizontal-horizontal register l'.

It should be noted that signal charges of odd pixels of the sensor array c left in the horizontal CCD transfer register h', if any, are transferred to the horizontal-horizontal transfer register m'.

In addition, signal charges of odd pixels of the sensor array b are also transferred from the horizontal CCD transfer register f' to the horizontal-horizontal transfer register k'.

It should be noted, that by setting the horizontal driving pulse signal φh2 at a low level at that time, signal charges of odd pixels of the sensor array a are transferred from the horizontal CCD transfer register e' back to the horizontal-horizontal transfer register j'.

In addition, signal charges of even pixels of the sensor array a are also transferred from the horizontal CCD transfer register d' back to the horizontal-horizontal transfer register j'.

Figure 6K:
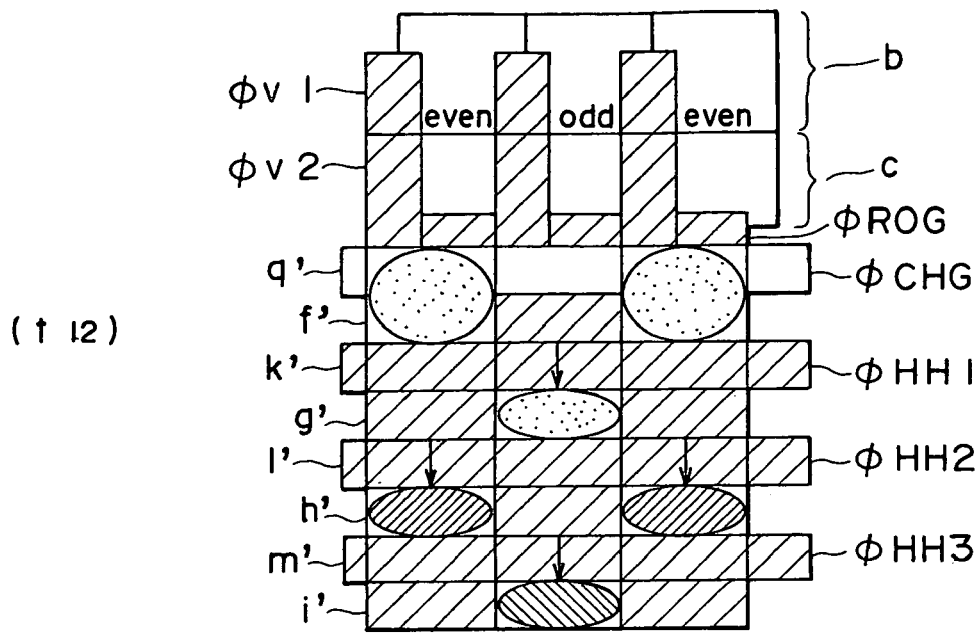

Then, at a point of time $t_{12}$, when the horizontal driving pulse signal φh1 is raised to a high level, the horizontal driving pulse signal φh2 is set at a low level, the vertical driving pulse signal φV1 is set at a low level, the vertical driving pulse signal φV2 is set at a low level, the read-out pulse signal φROG is set at a low level, the accumulation pulse signal φCHG is raised to a high level and the transfer pulse signals φHH1, φHH2 and φHH3 are set at a low level, signal charges of odd pixels of the sensor array c are transferred from the horizontal-horizontal transfer register m' to the horizontal CCD transfer register i' and signal charges of even pixels of the sensor array c are transferred from the horizontal-horizontal register l' to the horizontal CCD transfer register h' as shown in FIG. 6K.

In addition, signal charges of odd pixels of the sensor array b are also transferred from the horizontal-horizontal transfer register k' to the horizontal CCD transfer register g'.

Furthermore, since the horizontal driving pulse signal φh1 is at a high level, signal charges of even pixels of the sensor array b are transferred from the accumulation gate q' to the horizontal CCD transfer register f'.

It should be noted that by raising the horizontal driving pulse signal φh1 to a high level, signal charges of odd pixels of the sensor array a are transferred from the horizontal-horizontal transfer register j' to the horizontal CCD transfer register d'.

In addition, signal charges of even pixels of the sensor array a are also transferred from the horizontal-horizontal transfer register j' to the horizontal CCD transfer register e'.

Figure 6L:
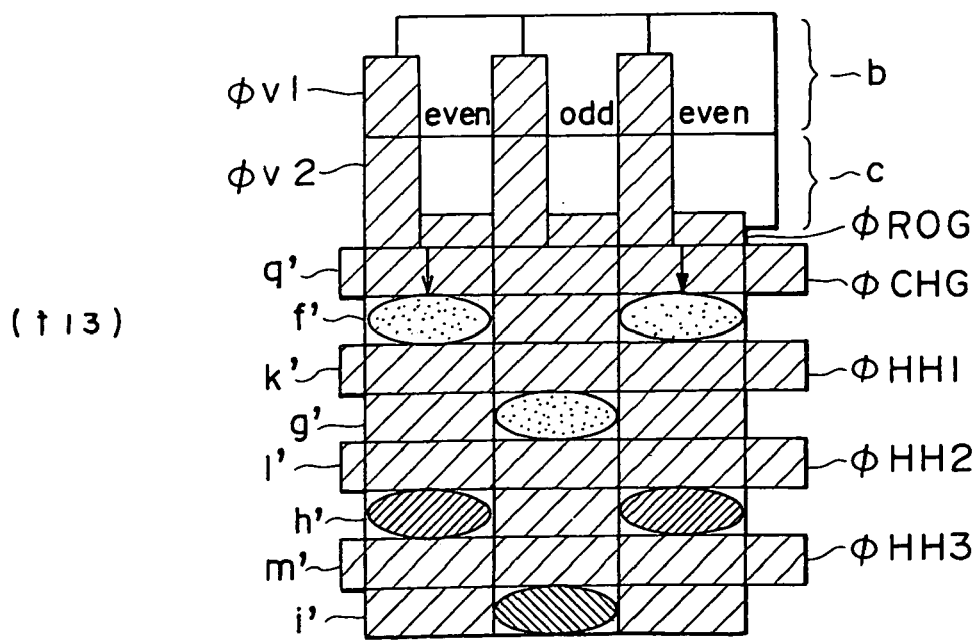

Then, at a point of time $t_{13}$, when the accumulation pulse signal φCHG is changed to a low level, signal charges left in accumulation gate q' such as signal charges of even pixels of the sensor array b are transferred to the horizontal CCD transfer register f' as shown in FIG. 6L.

At that time, signal charges left in accumulation gate p' such as signal charges of even pixels of the sensor array a are transferred to the horizontal CCD transfer register e' as well.

Thus, signal charges of pixels of the sensor arrays b and c are split into signal charges of even pixels and signal charges of odd pixels which are each transferred to the horizontal CCD transfer registers f', g', h' and i'.

In this state, by sequentially applying the horizontal driving pulse signls φh1 and φh2 to the horizontal CCD transfer registers f', g', h' and i', the signal charges can be transferred in the horizontal direction.

In addition, signal charges of pixels of the sensor array a are split into signal charges of even pixels and signal charges of odd pixels which are each transferred to the horizontal CCD transfer registers d' and e'. In this state, by sequentially applying the horizontal driving pulse signals φh1 and φh2 to the horizontal CCD transfer registers d' and e', the signal charges can be transferred in the horizontal direction.

In such transfers, signal charges of pixels of the sensor arrays a, b and c are split into signal charges of even pixels and signal charges of odd pixels which can then be output without generating differences in time between sensor arrays.

Since the sensor arrays a, b and c are laid out adjacently to each other, a spatial deviation in operation to read signal charges can be reduced considerably, so that color difference and the like can be eliminated without the need to provide a memory or a correction circuit at a stage after a conversion unit for converting an electric charge into a voltage.

The embodiments described above each have a configuration including an electrode of a read-out gate and an electrode of an accumulation gate. It should be noted, however, that it is also possible to provide a gate electrode common to both a read-out gate and an accumulation gate. Such a configuration is described as follows.

Figure 8A:
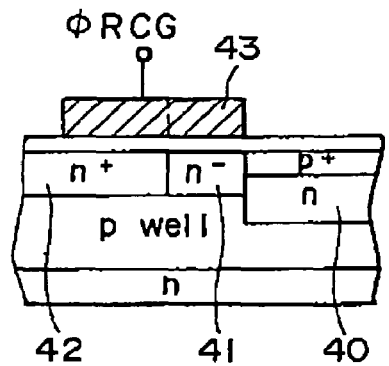
FIG. 8A is a cross-sectional diagram showing main elements of a configuration of an embodiment wherein a read-out gate and an accumulation gate share a common gate electrode.
Figure 8B:
FIG. 8B is a diagram showing electric potentials of the read-out gate and the accumulation gate shown in FIG. 8A.
Figure 9:
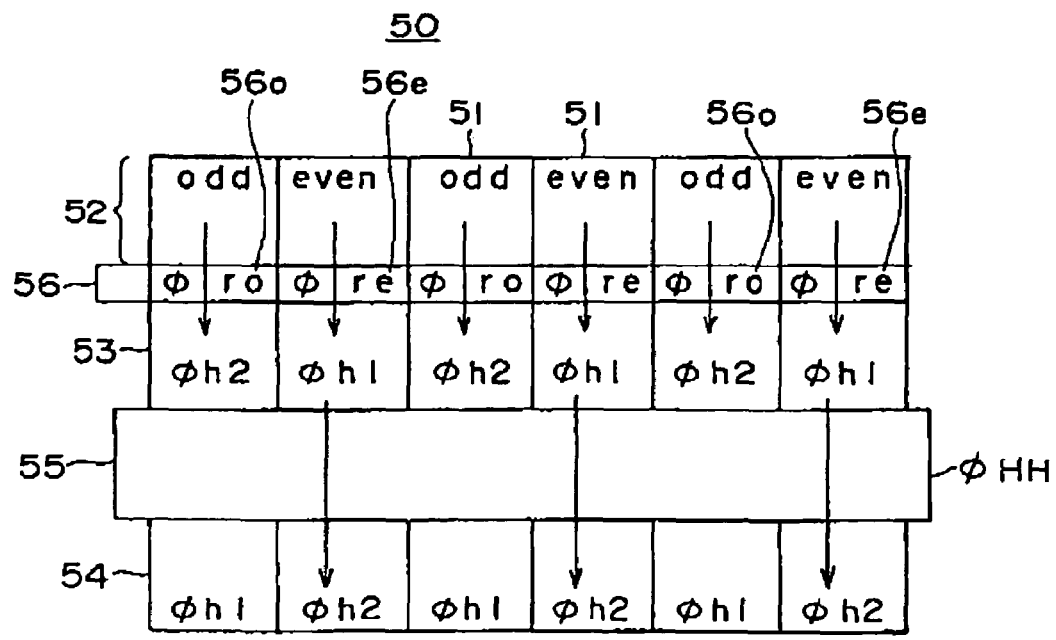
FIG. 9 is a schematic diagram showing a top view of the related art linear sensor.
Figure 10:
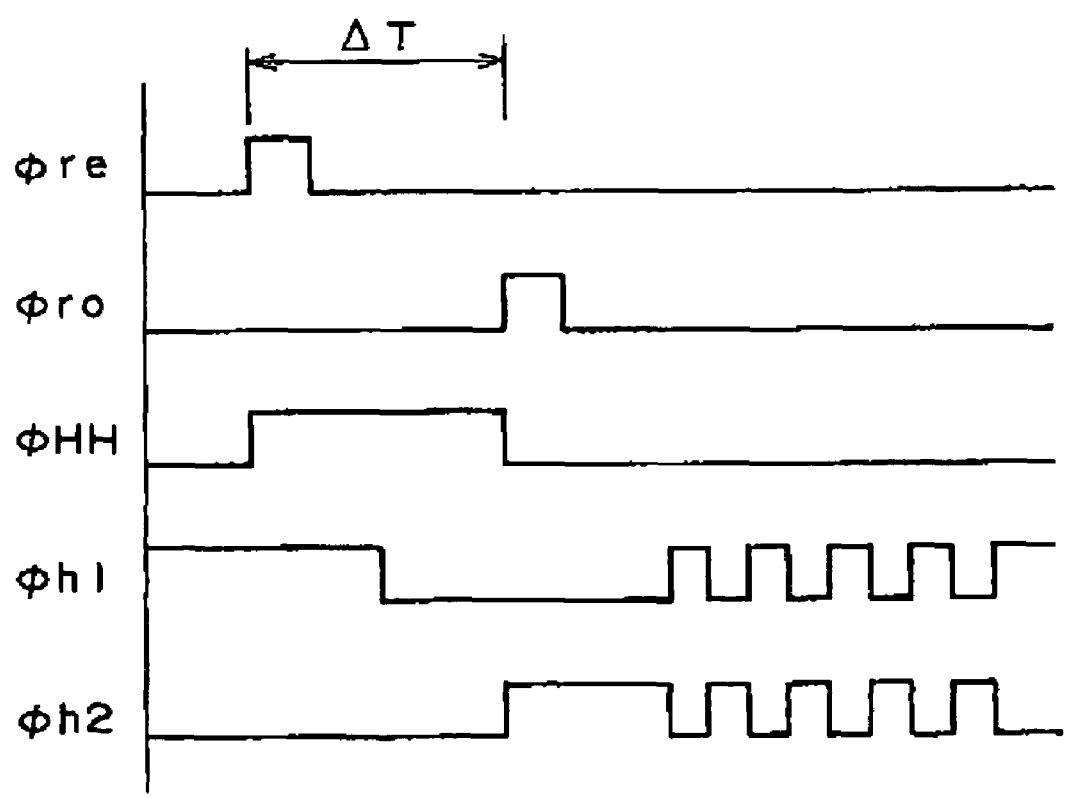
FIG. 10 is a diagram showing typical timings to drive the related art linear sensor shown in FIG. 9.

As shown in FIG. 8A, a portion 41 serving as a read-out gate on the surface of a semiconductor unit and a portion 42 serving as an accumulation gate are provided at impurity concentrations n− and n+ which are different from each other to give a configuration wherein the electric potential at the accumulation gate 42 side is low as shown in FIG. 8B. Built on these areas 41 and 42, a common electrode 43 is driven by a driving pulse signal φRCG.

In such a configuration, signal charges of sensors 40 of the sensor array can be read out and stored in the accumulation gate 42 at the same time to be allocated to a plurality of horizontal CCD transfer registers as is the case with the configuration wherein gate electrodes are provided separately for the read-out gate 41 and the accumulation gate 42.

By providing a configuration wherein the read-out gate 41 and an accumulation gate 42 share a common electrode 43 as described above, the number of electrodes can be reduced and the manufacturing process can thus be made simpler.

In addition, even if the gate electrode 43 is thick, the total width of the read-out gate 41 and the accumulation gate 42 can be made small in comparison with a configuration wherein gate electrodes are provided separately for the read-out gate 41 and the accumulation gate 42. By making the gate electrode 43 thick, the resistance of the gate electrode 43 can be reduced. In addition, a thick gate electrode 43 also offers a merit that the gate electrode 43 and a contact between the gate electrode 43 and a wiring layer on the electrode 43 can be formed with ease. Another merit is that, by reducing the total electrode width, the gap between two adjacent sensors can also be decreased as well.

When only one sensor array is associated with the accumulation gate 42, only one driving timing is required by the accumulation gate 42 to read out signal charges. Thus, the accumulation gate 42 and the read-out gate 41 can be configured to share a common gate electrode 43 as described above.

Thus, the accumulation gate 42 and the read-out gate 41 sharing a common gate electrode 43 can be applied to the uppermost sensor array a in the configurations shown in FIGS. 1, 3, 4 and 5.

According to the embodiments of the present invention, signal charges of sensors are transferred to an accumulation gate at the same time, so that variations in accumulation period from sensor to sensor can be eliminated. As a result, spatial and time deviations in signal-charge fetching and difference in sensitivity caused by differences in read-out timing are basically eliminated.

Accordingly, a good signal output can be obtained in the solid-state image-pickup device and signal charges can be transferred at a high speed by allocating the signal charges to a plurality of transfer registers.

The embodiments described above each implement a linear sensor provided by the present invention. It should be noted that the present invention can also be applied to an area sensor wherein sensors are laid out to form a matrix.

In the case of an area sensor, a series of sensors along a horizontal line in the 2-dimensional sensor matrix is regarded as a sensor array.

In the configuration of an area sensor, typically, each sensor array includes a vertical transfer register to which signal charges read out from sensor are transferred. The signal charges are further transferred to a plurality of horizontal transfer registers through which the signal charge is forwarded to be finally output. The configuration also includes an accumulation gate provided between the vertical transfer register and the horizontal transfer registers.

The accumulation gate distributes signal charges among the horizontal transfer registers.

Thus, signal charges are transferred also at a high speed in the area sensor.

It should be noted that the solid-state image-pickup device and the method to drive the device are not limited to the embodiments described above. It is possible to provide a variety of configurations in a range not deviating from the essentials of the present invention.

According to the present invention, by transferring signal charges from sensors to an accumulation gate at the same time, spatial and time deviations in electric-charge fetching and differences in sensitivity caused by differences in read-out timing can be basically eliminated.

As a result, a good signal output can be obtained in the solid-state image-pickup device and signal charges can be transferred at a high speed by allocating the signal charges to a plurality of transfer registers.

While the preferred embodiments have been described using specific terms, such description is for illustrative purposes only, and it is to be understood that changes and variations may be made without departing from the spirit or scope of the following claims.

What is claimed is:

1. A solid-state image-pickup device having:
   a sensor array comprising a plurality of sensors; and
   a first and second transfer register for transferring signal charges generated in said sensors of said sensor array,
   at least a third transfer register formed between said first transfer register and said second transfer register for storing temporarily and transferring said signal charges from said first transfer register to said second transfer register;
   wherein a read-out gate is provided between the sensor array and an accumulation gate for reading-out charges generated in the sensor array to an accumulation region adjacent the accumulation gate as a function of an applied read-out gate control signal, the accumulation gate is provided between the read-out gate and said first transfer register; and wherein each of said first and second transfer registers receives and concurrently transfers signal charges derived from a single row of pixels of said sensor array, and wherein the first of the two transfer registers transfers signal charges from a different row than the second of the two transfer registers.

2. A solid-state image-pickup device having:

a sensor array comprising a plurality of sensors; and first and second transfer registers for transferring signal charges generated in said sensors of said sensor array, at least a third transfer register is formed between said first transfer register and said second transfer register for storing temporarily and transferring said signal charges from said first transfer register to said second transfer register;

wherein a read-out gate is provided between the sensor array and an accumulation gate for reading-out charges generated in the sensor array to an accumulation region adjacent the accumulation gate as a function of an applied read-out gate control signal, the accumulation gate is provided between the read-out gate and said first transfer register, the accumulation region being directly connected to the sensor array via the readout gate without any vertical transfer registers between the sensor array and the accumulation region; and wherein each of said first and second transfer registers receives and concurrently transfers signal charges derived from a single row of pixels of said sensor array, and wherein the first of the two transfer registers transfers signal charges from a different row than the second of the two transfer registers.

3. A solid-state image-pickup device having:

a sensor array comprising a plurality of sensors; and first, second, third, and fourth transfer registers for transferring signal charges generated in said sensors of said sensor array, at least three inter-register transfer registers, each formed respectively between said first, second, third, and fourth transfer registers for storing temporarily and transferring said signal charges from said first to fourth transfer registers;

wherein a read-out gate is provided between the sensor array and an accumulation gate for reading-out charges generated in the sensor array to an accumulation region adjacent the accumulation gate as a function of an applied read-out gate control signal, the accumulation gate is provided between the read-out gate and said first transfer register, and wherein said four transfer registers receive and concurrently transfer signal charges derived from at least two rows of pixels of said sensor array, and wherein a first and second of the four transfer registers transfers signal charges from a different row than a third and fourth of the four transfer registers.

4. The solid-state image-pickup device according to claim 3, further including fifth and sixth transfer registers, each of the six transfer registers receives and concurrently transfers signal charges derived from at least three rows of pixels of said sensor array, and wherein a fifth and sixth of the six transfer registers transfers signal charges from a different row than any one of a first through fourth transfer registers.

5. A solid-state image-pickup device having:

a sensor array comprising a plurality of sensors; and first, second, third, and fourth transfer registers for transferring signal charges generated in said sensor of said sensor array, at least three inter-register transfer registers, each formed respectively between said first, second, third, and fourth transfer registers for storing temporarily and transferring said signal charges from said first to fourth transfer registers;

wherein a read-out gate is provided between the sensor array and an accumulation gate for reading-out charges generated in the sensor array to an accumulation region adjacent the accumulation gate as a function of an applied read-out gate control signal, the accumulation gate is provided between the read-out gate and said first transfer register, the accumulation region being directly connected to the sensor array via the readout gate without any vertical transfer registers between the sensor array and the accumulation region, and wherein said four transfer registers receive and concurrently transfer signal charges derived from at least two rows of pixels of said sensor array, and wherein a first and second of the four transfer registers transfers signal charges from a different row than a third and fourth of the four transfer registers.

6. The solid-state image-pickup device according to claim 5, further including fifth and sixth transfer registers, each of the six transfer registers receives and concurrently transfers signal charges derived from at least three rows of pixels of said sensor array, and wherein a fifth and sixth of the six transfer registers transfers signal charges from a different row than any one of a first through fourth transfer registers.

7. The method of driving a solid-state image-pickup device according to claim 5, further including fifth and sixth adjacent transfer registers, and an additional reading out step in which third signal charges generated in a third single row of said sensors different than said first or second row to said accumulation region at a same time via the read-out gate;

and an additional allocating step in which said third signal charges of said sensors are allocated from said accumulation region to the fifth and sixth transfer registers; and said driving step includes driving said fifth and sixth transfer registers to output signal charges.

8. A method of driving a solid-state image-pickup device having:

a sensor array comprising a plurality of sensors; and first and second transfer registers for transferring signal charges generated in said sensors of said sensor array, at least one inter-register transfer registers, formed between said first and second transfer register for storing temporarily and transferring said signal charges from said first to said second transfer register;

wherein a read-out gate is provided between the sensor array and an accumulation gate for reading-out charges generated in the sensor array to an accumulation region adjacent the accumulation gate as a function of an applied read-out gate control signal, the accumulation gate is provided between the read-out gate and said first transfer register, and said method comprising the steps of:

reading out signal charges generated in a single row of said sensors to said accumulation region at a same time via the read-out gate;

allocating said signal charges of said sensors from said accumulation region to said first transfer register and said second transfer register such that a first of the two transfer registers transfers signal charges from a different row than a second of the two transfer registers;

driving said first and second transfer registers to output said signal charges.

9. A method of driving a solid-state image-pickup device having:
- a sensor array comprising a plurality of sensors; and
- first, second, third, and fourth transfer registers for transferring signal charges generated in said sensors of said sensor array,
- at least three inter-register transfer registers, each formed respectively between said first, second, third, and fourth transfer registers for storing temporarily and transferring said signal charges from said first to fourth transfer registers;
- wherein a read-out gate is provided between the sensor array and an accumulation gate for reading-out charges generated in the sensor array to an accumulation region adjacent the accumulation gate as a function of an applied read-out gate control signal, the accumulation gate is provided between the read-out gate and said first transfer register, and said method comprising the steps of:
- reading out first signal charges generated in a first single row of said sensors to said accumulation region at a same time via the read-out gate;
- allocating said first signal charges of said sensors from said accumulation region to a first two adjacent transfer registers out of said four transfer registers;
- and reading out second signal charges generated in a second single row of said sensors different than said first row to said accumulation region at a same time via the read-out gate;
- allocating said second signal charges of said sensors from said accumulation region to the remaining two adjacent transfer registers out of said four transfer registers;
- driving said four transfer registers to output said signal charges.

* * * * *